(12) United States Patent
Wang et al.

(10) Patent No.: US 12,326,382 B2
(45) Date of Patent: Jun. 10, 2025

(54) DETECTION LABEL FOR DETECTING LIQUID THAT FLOWS IN ELECTRONIC DEVICE

(71) Applicant: HONOR DEVICE CO., LTD., Shenzhen (CN)

(72) Inventors: Yuan Wang, Shenzhen (CN); Xuyang Wang, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 227 days.

(21) Appl. No.: 17/802,294

(22) PCT Filed: Nov. 12, 2020

(86) PCT No.: PCT/CN2020/128270
§ 371 (c)(1),
(2) Date: Aug. 25, 2022

(87) PCT Pub. No.: WO2021/169409
PCT Pub. Date: Sep. 2, 2021

(65) Prior Publication Data
US 2023/0088656 A1    Mar. 23, 2023

(30) Foreign Application Priority Data

Feb. 27, 2020    (CN) ......................... 202010122716.4

(51) Int. Cl.
*G01M 3/20*     (2006.01)
*G09F 3/00*     (2006.01)
(Continued)

(52) U.S. Cl.
CPC ............ *G01M 3/20* (2013.01); *G09F 3/0291* (2013.01); *G09F 3/10* (2013.01); *H05K 5/0252* (2013.01);
(Continued)

(58) Field of Classification Search
CPC ........... G09F 3/0292; G09F 2003/0277; G09F 2007/005; G01N 31/222; G01D 7/005; G01D 3/08
See application file for complete search history.

(56) References Cited

U.S. PATENT DOCUMENTS

3,680,364 A * 8/1972 Carrier ................. G01N 31/222
                                                          73/73
4,098,120 A * 7/1978 Manske ................. G01N 21/81
                                                          116/200
(Continued)

FOREIGN PATENT DOCUMENTS

CN    1564854 A    1/2005
CN    2783466 Y    5/2006
(Continued)

*Primary Examiner* — Tran M. Tran
(74) *Attorney, Agent, or Firm* — Fish & Richardson P.C.

(57) ABSTRACT

Embodiments of this application provide a detection label for an electronic device and an electronic device. The detection label includes a detection part and an adhesive layer, where the detection part is configured to detect whether liquid flows into an electronic device, and the adhesive layer is configured to connect the detection part to a housing of the electronic device. The detection part has a first surface, the first surface is a surface of a side facing towards the housing, the adhesive layer may be disposed on the first surface, and an area of the adhesive layer is less than an area of the first surface. In this way, a part of the first surface is not covered with the adhesive layer, and liquid can be in contact with the first surface, so that the detection part can perform detection in a plurality of directions simultaneously.

14 Claims, 4 Drawing Sheets

(51) Int. Cl.
*G09F 3/10* (2006.01)
*H05K 5/02* (2006.01)
*G09F 3/02* (2006.01)

(52) U.S. Cl.
CPC ............... *G09F 2003/023* (2013.01); *G09F 2003/0257* (2013.01)

(56) References Cited

U.S. PATENT DOCUMENTS

| | | | | |
|---|---|---|---|---|
| 4,130,012 A * | 12/1978 | Lockerby | ............. | G01N 31/222 422/537 |
| 4,895,567 A * | 1/1990 | Colon | ...................... | C09J 11/02 524/718 |
| 6,628,785 B1 * | 9/2003 | Kitamura | ............... | G09F 3/0291 379/451 |
| 6,698,378 B1 * | 3/2004 | Dick | .................... | G01N 31/222 73/29.04 |
| 6,815,207 B2 * | 11/2004 | Yabuki | ................. | G01N 31/222 436/39 |
| 7,105,225 B2 | 9/2006 | Birkholz et al. | | |
| 7,732,046 B2 * | 6/2010 | LaBrosse | ............... | B32B 27/30 428/355 R |
| 7,744,997 B2 * | 6/2010 | Birkholz | .............. | G01N 31/222 428/354 |
| 7,892,639 B2 | 2/2011 | Mess et al. | | |
| 7,985,701 B2 * | 7/2011 | Nakashima | .......... | D06N 3/0063 442/164 |
| 8,210,032 B2 * | 7/2012 | Sanford | ............... | G01N 31/222 73/29.02 |
| 8,440,274 B2 * | 5/2013 | Wang | ...................... | G01D 7/00 73/29.02 |
| 8,673,237 B2 * | 3/2014 | Schalkhammer | ...... | G01N 21/78 422/430 |
| 8,783,206 B2 | 7/2014 | Kwak | | |
| 8,978,574 B2 | 3/2015 | Huynh | | |
| 9,086,298 B2 * | 7/2015 | Wang | ................... | G01N 31/222 |
| 9,300,773 B2 * | 3/2016 | Mittleman | .......... | H04M 1/0274 |
| 9,488,504 B2 * | 11/2016 | Wang | ................... | G06F 1/1626 |
| 9,505,001 B2 * | 11/2016 | Chuang | ............. | B01L 3/502715 |
| 9,606,045 B2 * | 3/2017 | Stevens | ................ | G01N 31/222 |
| 9,683,872 B2 * | 6/2017 | Noe | ......................... | C09D 7/61 |
| 9,739,757 B2 * | 8/2017 | Taylor | ................... | B32B 37/185 |
| 9,823,177 B2 * | 11/2017 | Dameron | ............ | G01N 15/0826 |
| 10,578,559 B2 * | 3/2020 | Silvanto | ............ | G01N 21/8803 |
| 10,892,199 B2 * | 1/2021 | Chen | .................... | H01L 21/4803 |
| 10,964,495 B2 * | 3/2021 | Furuuchi | ............ | H01M 10/04 |
| 11,039,960 B2 * | 6/2021 | Etchells | ............ | A61F 13/00055 |
| 11,077,636 B2 * | 8/2021 | Karan | .................... | B31D 1/027 |
| 11,143,597 B2 * | 10/2021 | Praharaj | ................. | G01D 7/005 |
| 11,231,384 B2 * | 1/2022 | Chang | .................. | G01N 27/225 |
| 11,530,992 B2 * | 12/2022 | Suzuki | ................. | C09D 183/04 |
| 11,561,190 B2 * | 1/2023 | Ikoma | .................... | G01N 27/12 |
| 2007/0157702 A1 * | 7/2007 | Hamada | ............... | G01N 31/222 206/459.1 |
| 2008/0145611 A1 * | 6/2008 | Mess | ...................... | B32B 27/36 428/409 |
| 2009/0273480 A1 | 11/2009 | Mittleman et al. | | |
| 2010/0304091 A1 * | 12/2010 | Wang | ...................... | G01D 7/00 428/480 |
| 2012/0067270 A1 * | 3/2012 | Huynh | ................. | G01N 31/222 116/206 |
| 2012/0137959 A1 | 6/2012 | Kwak | | |
| 2013/0052848 A1 * | 2/2013 | Sloey | .................... | H01R 13/52 439/271 |
| 2016/0245768 A1 * | 8/2016 | Shim | ................... | G01M 3/147 |
| 2019/0212311 A1 * | 7/2019 | Hammond | ......... | A61B 5/14539 |

FOREIGN PATENT DOCUMENTS

| | | |
|---|---|---|
| CN | 101583986 A | 11/2009 |
| CN | 202145362 U | 2/2012 |
| CN | 103843050 A | 6/2014 |
| CN | 204029278 U | 12/2014 |
| CN | 204496843 U | 7/2015 |
| CN | 105577873 A | 5/2016 |
| CN | 207530872 U | 6/2018 |
| JP | 2001051600 A | 2/2001 |
| JP | 2001177268 A | 6/2001 |
| JP | 3554524 B2 | 8/2004 |
| JP | 2005010525 A | 1/2005 |
| JP | 4635443 B2 | 2/2011 |
| KR | 20120063132 A | 6/2012 |
| WO | 2009152203 A1 | 12/2009 |

* cited by examiner

DETECTION LABEL FOR DETECTING LIQUID THAT FLOWS IN ELECTRONIC DEVICE

CROSS-REFERENCE TO RELATED APPLICATIONS

This application is a National Stage of International Application No. PCT/CN2020/128270, filed Nov. 12, 2020, which claims priority to Chinese Patent application Ser. No. 20/201,0122716.4, filed Feb. 27, 2020, both of which are hereby incorporated by reference in their entireties.

TECHNICAL FIELD

This application relates to the field of electronic device technologies, and in particular, to a detection label for an electronic device and an electronic device.

BACKGROUND

Electronic devices such as mobile phones and tablet computers generally have structures such as headphone jacks and card slots. These structures communicate with interiors of the electronic devices, and also communicate with the outside. During use of the electronic devices, liquid may easily flow into the electronic devices through the structures such as the headphone jacks and the card slots, thereby causing faults to the electronic devices. For ease of determining, during maintenance, whether faults are caused by liquid entering the electronic devices, detection labels are generally disposed on the headphone jacks and the card slots. When liquid is in contact with the detection labels, the detection labels change, for example, change the color, so that a maintainer can quickly determine whether the faults are caused by the liquid. Generally, an adhesive is applied to a side of a detection label facing towards a housing and covers an entire surface of this side, so that the detection label is connected to the housing in an attached manner. In this case, liquid cannot permeate through an adhesive layer, and the side of the detection label coated with the adhesive is unable to perform liquid inlet recognition.

SUMMARY

In view of the problem existing in the background, an objective of this application is to provide a detection label for an electronic device and an electronic device, so as to resolve the problem in the prior art that a side of a detection label for an electronic device facing towards a housing cannot be configured to detect whether liquid flows in.

According to a first aspect of embodiments of this application, a detection label for an electronic device is provided. The detection label includes:
 a detection part, where the detection part is configured to detect whether liquid flows into an electronic device; and
 an adhesive layer, where the adhesive layer is configured to connect the detection part to a housing of the electronic device;
 where the detection part has a first surface, the first surface is a surface facing towards the housing, the adhesive layer is located on the first surface, and an area of the adhesive layer is less than an area of the first surface.

In the detection label provided in this embodiment of this application, an area of the adhesive layer is reduced, so that a part of the first surface is not covered with the adhesive layer. This part of the first surface can be in contact with liquid, so that a side of the detection part facing towards the housing can also be configured to detect whether liquid flows into the electronic device. Accuracy of detection results is improved, a maintainer easily identifies the fault cause of the electronic device and then can quickly formulate a maintenance scheme, and maintenance efficiency is improved.

In a possible implementation, at least one first through-hole is provided at the adhesive layer, and in a direction perpendicular to the first surface, the first through-hole runs through the adhesive layer.

The first through-hole is provided at the adhesive layer, so as to reduce an area of the adhesive layer, so that a part of the first surface is not covered with the adhesive layer. When liquid flows in from the side of the housing, the liquid can flow to the first surface of the detection part through the first through-hole and be in contact with the first surface, so as to enable the detection part to change.

In a possible implementation, the adhesive layer is annular, and the adhesive layer is disposed along an edge of the first surface.

The adhesive layer is set to be annular, so as to reserve a corresponding region allowing the first surface to be in contact with liquid, so that a side (the first surface) of the detection part facing towards the housing can be configured to detect whether liquid flows into the electronic device.

In a possible implementation, the detection part is a water-soluble color layer.

The detection part is set to be a water-soluble color layer, so that the detection part can change the color after being in contact with liquid, and the maintainer can determine, by observing whether the detection part changes the color, whether liquid flows into the electronic device and then identify fault causes of the electronic device.

In a possible implementation, the detection part is a liquid inlet color-change base material.

The detection part is set to be a liquid inlet color-change base material, and when liquid is in contact with the detection part, the detection part can change accordingly, so that the maintainer can determine, by observing the detection part, whether liquid flows into the electronic device and then identify fault causes of the electronic device.

In a possible implementation, the detection label further includes a protection layer, where the detection part has a second surface, the second surface faces towards the first surface, and the protection layer is located on the second surface.

With arrangement of the protection layer, the detection part can be protected, and the possibility that the detection part is damaged is reduced. In addition, in a nano coating process, the protection layer increases a thickness of the detection label, so that the possibility that a coating material is attached to the detection part can be reduced, thereby reducing impact of nano coating on the detection part and improving accuracy of detection results of the detection label.

In a possible implementation, the detection label further includes water absorption paper, where the detection part has a second surface, the second surface faces towards the first surface, and the water absorption paper is located on the second surface.

With arrangement of the water absorption paper, liquid flowing into the electronic device can be collected and gathered, so that the detection part is in contact with the liquid. When only a small quantity of liquid flows in, the liquid is collected by the water absorption paper, so as to reduce the possibility that an excessive small quantity of liquid entering the electronic device cannot be detected by the detection part or the liquid is not in contact with the detection part but directly flows into the electronic device. In addition, the water absorption paper can further have a particular protection effect, so as to reduce the possibility that liquid flows into the electronic device.

In a possible implementation, the first through-hole is provided at the adhesive layer, a second through-hole is provided on the detection part, a third through-hole is provided on the water absorption paper, and the first through-hole, the second through-hole, and the third through-hole communicate.

The first through-hole, the second through-hole, and the third through-hole communicate to form a flow path, and liquid flowing in from the side of the housing can flow along the flow path to be in contact with the detection part, so that the flow path can implement a guide effect. In addition, in such a design, an area of the detection part in contact with liquid can also be increased, and an inner surface of the second through-hole may also be configured to detect whether liquid flows into the electronic device, so that accuracy of detection results of the detection label can be improved.

In a possible implementation, the adhesive layer is a water color-change adhesive layer.

The adhesive layer is set to be a water color-change adhesive layer, so that the maintainer can more easily determine the side from which the liquid flows into the electronic device. When the adhesive layer does not change the color, it is determined that the liquid flows into the electronic device from a side of the detection label away from the housing; or when the adhesive layer changes the color, it is determined that the liquid flows into the electronic device from the side of the housing.

According to a second aspect of this application, an electronic device is provided. The electronic device includes a housing and a detection label for an electronic device, where the detection label is connected to the housing; and the detection label is the detection label for an electronic device according to any one of the foregoing embodiments.

In a possible implementation, the housing includes a fourth through-hole, where at least a part of the detection part communicates with the fourth through-hole.

The fourth through-hole is provided on the housing, so that liquid flowing in from the side of the housing can be in contact with the detection part through the fourth through-hole, and the detection label can perform detection in a plurality of directions.

Embodiments of this application provide a detection label for an electronic device and an electronic device. The detection label includes a detection part and an adhesive layer, where the detection part is configured to detect whether liquid flows into an electronic device, and the adhesive layer is configured to connect the detection part to a housing of the electronic device. Specifically, when being in contact with liquid, the detection part may change significantly, for example, change the color or change the form (may swell or have other changes), so that the maintainer can determine, by observing the detection part, whether liquid flows into the electronic device. The detection part has a first surface, the first surface is a surface of a side facing towards the housing, the adhesive layer may be disposed on the first surface, and an area of the adhesive layer is less than an area of the first surface. In this way, a part of the first surface is not covered with the adhesive layer, and liquid can be in contact with the first surface, so that the first surface can also be configured to detect whether liquid flows into the electronic device, and the detection part can perform detection in a plurality of directions simultaneously. When liquid flows in from any direction, the detection part can be in contact with the liquid and change, so as to remind the maintainer that liquid flows into the electronic device.

It should be understood that the foregoing general description and the following detailed description are only examples and are not intended to limit this application.

REFERENCE NUMERALS

Figure 1:
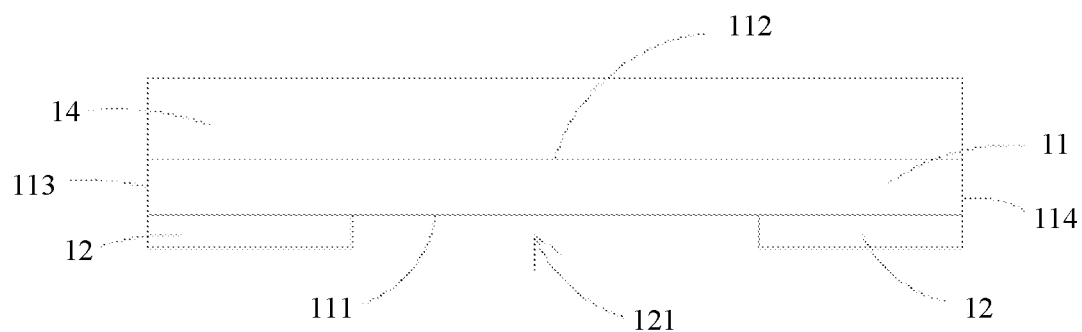
FIG. 1 is a schematic structural diagram of a detection label according to a first embodiment of this application.

1. Detection label;
11. Detection part;
111. First surface;
112. Second surface;
113. Third surface;
114. Fourth surface;
115. Second through-hole;
116. Water-soluble color layer;
117. Liquid inlet color-change base material;
12. Binder layer;
121. First through-hole;
122. Water color-change adhesive layer;
13. Protection layer;
14. Water absorption paper;
141. Third through-hole;
2. Housing;
21. Fourth through-hole;
3. Card slot;
4. Card tray;
5. Headphone jack;
6. USB interface.

The accompanying drawings herein are incorporated into this specification and form a part of this specification, illustrate the embodiments conforming to this application, and are intended to explain the principles of this application together with this specification.

DESCRIPTION OF EMBODIMENTS

To help better understand the technical solutions of this application, the following describes the embodiments of this application with reference to the accompanying drawings.

Apparently, the described embodiments are merely some but not all of the embodiments of this application. All other embodiments obtained by a person of ordinary skill in the art based on the embodiments of this application without creative efforts shall fall within the protection scope of this application.

The terms used in the embodiments of this application are merely intended to describe specific embodiments, but not intended to limit this application. The terms "a/an", "the" and "this" of singular forms used in the embodiments and the appended claims of this application are also intended to include plural forms, unless otherwise specified in the context clearly.

It should be understood that the term "and/or" used in this specification describes an association relationship for describing associated objects and represents that three relationships may exist. For example, A and/or B may represent the following three cases: Only A exists, both A and B exist, and only B exists. In addition, the symbol "/" in this specification generally represents an "or" relationship between associated objects.

It should be noted that the directional terms such as "above", "under", "left", and "right" described in the embodiments of this application are described as seen from the angles shown in the accompanying drawings, and should not be understood as limitations to the embodiments of this application. In addition, in the context, it should be further understood that when an element is referred to as being "above" or "under" another element, the element can not only be directly connected "above" or "under" the another element, but also be indirectly connected "above" or "under" the another element through an intermediate element.

With the development of science and technology, electronic devices such as mobile phones and tablet computers have already become common electronic devices for people. To allow people to use easily and enrich functions of electronic devices, the electronic devices such as mobile phones and tablet computers generally further include structures such as headphone jacks and card slots. These structures communicate with interiors of the electronic devices, and also communicate with the outside. Therefore, during use of the electronic devices, liquid can flow into the electronic devices through the structures such as the headphone jacks and the card slots. Because many electronics are provided in the electronic devices, when liquid flows in, phenomena such as short circuit easily occur, and consequently, the electronic devices fail and cannot be normally used.

To enable the maintainer to quick determine whether faults of the electronic devices are caused by liquid flowing into the electronic devices, generally detection labels are disposed on positions such as headphone jacks and card slots. When liquid flows in through the positions such as the headphone jacks and the card slots, the liquid is in contact with the detection labels, and after being in contact with the liquid, the detection labels change, for example, change the color, so that the maintainer can determine, by observing whether the detection labels change, whether liquid flows into the electronic devices, and then the maintainer easily identifies the fault cause.

Generally, a detection label is connected to a housing of an electronic device in an attached manner. Specifically, an adhesive is applied to a side of the detection label facing towards the housing, so that the structural adhesive covers a surface of the side of the detection label facing towards the housing and is configured to be connected to the housing. In such a design, after a side of the detection label away from the housing is in contact with liquid, the detection label changes. However, the structural adhesive is applied to the side facing towards the housing, and liquid flowing in from the side of the housing cannot permeate through the adhesive layer, so that the liquid cannot be in contact with the detection label and enable the detection label to change. When liquid flows into the electronic device from the side of the housing, the maintainer cannot determine, by observing the detection label, whether faults are caused by the liquid flowing into the electronic device. Consequently, the maintainer cannot easily determine the fault cause.

In view of this, embodiments of this application provide a detection label for an electronic device and an electronic device, so as to resolve the problem in the prior art that a side of a detection label facing towards a housing cannot detect liquid.

As shown in FIG. 1, an embodiment of this application provides a detection label 1 for an electronic device. The detection label 1 may include a detection part 11 and an adhesive layer 12, where the detection part 11 is configured to detect whether liquid flows into an electronic device, when liquid flows into the electronic device, the liquid is in contact with the detection part 11 and enable the detection part 11 to change, and the adhesive layer 12 is configured to connect the detection part 11 to a housing 2 of the electronic device. Specifically, the detection part 11 has a first surface 111, the first surface 111 is a surface of the detection part 11 facing towards the housing 2 of the electronic device, the adhesive layer 12 is disposed on the first surface 111, and an area of the adhesive layer 12 is less than an area of the first surface 111.

In such a design, a part of the first surface 111 can be not covered with the adhesive layer 12, and liquid flowing in from the side of the housing 2 can be in contact with the first surface 111 and enable the detection part 11 to change, and the side of the detection label 1 facing towards the housing 2 can also be configured to detect whether liquid flows into the electronic device.

In the detection label 1 provided in this embodiment of this application, an area of the adhesive layer 12 contact with the detection part 11 is reduced, so as to increase an area of the detection part 11 that may be configured to detect liquid, so that the detection part 11 can perform detection in a plurality of directions. Therefore, the maintainer can accurately determine, during maintenance of the electronic device, whether faults are caused by the liquid flowing into the electronic device, time is saved for the maintainer, and the fault cause can be determined more accurately, and the maintainer can more quickly determine the fault cause and take specific maintenance measures.

As shown in FIG. 1, in a possible implementation, at least one first through-hole 121 is provided at the adhesive layer 12, and in a direction perpendicular to the first surface 111, the first through-hole 121 runs through the adhesive layer 12.

The first through-hole 121 is provided at the adhesive layer 12, so as to reduce an area of the adhesive layer 12 covering the first surface 111, so that the first surface 111 can be partially configured to detect liquid. Based on actual needs, one or more first through-holes 121 may be provided. A specific position of the first through-hole 121 may also be determined based on actual situations. Specifically, the first through-hole 121 may be disposed in a position which liquid flows in easily, so that the detection label 1 detects liquid more accurately.

As shown in FIG. 1, in a possible implementation, the adhesive layer 12 may be annular, and the adhesive layer 12 is disposed along an edge of the first surface 111, so that a middle region of the first surface 111 is not covered.

In this way, the region that may be configured to detect liquid may be reserved on the first surface 111. In addition, on the premise of satisfying connection stability, an area of the adhesive layer 12 can be reduced as much as possible, so as to increase an area of the first surface 111 that may be configured to detect liquid, thereby improving detection accuracy.

Figure 2:
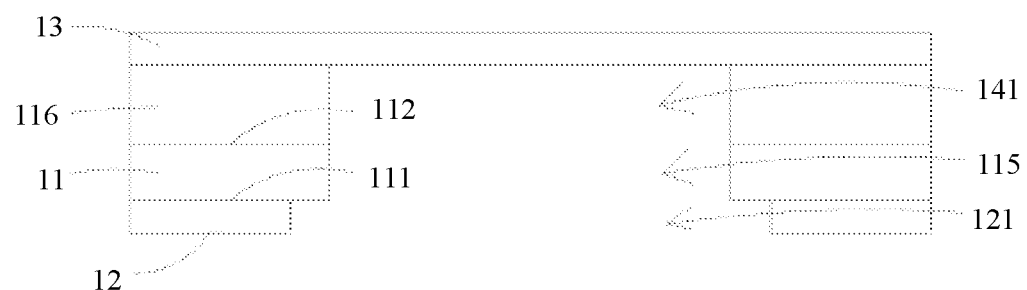
FIG. 2 is a schematic structural diagram of a detection label according to a second embodiment of this application.

As shown in FIG. 2, in a possible implementation, the detection part 11 is a water-soluble color layer 116.

The detection part 11 is set to be a water-soluble color layer 116. When the water-soluble color layer 116 is in contact with liquid, water-soluble pigments disposed on the detection part 11 can be dissolved in water to enable the detection part 11 to change the color, so that the maintainer can quickly learn, by observing the color of the detection part 11, whether liquid flows into the electronic device. When the detection part 11 changes the color, the maintainer can first consider that the fault cause of the electronic device is the liquid flowing into the electronic device, and then take corresponding measures to maintain the electronic device. When the detection part 11 does not change the color, the maintainer can temporarily rule out the possibility that liquid flows into the electronic device, identify fault causes of the electronic device one by one in other manners to determine the true fault cause of the electronic device, and then take specific maintenance measures. With the color change of the detection part 11, the maintainer can quickly identify fault causes of the electronic device, and work efficiency during maintenance can be improved.

Figure 3:
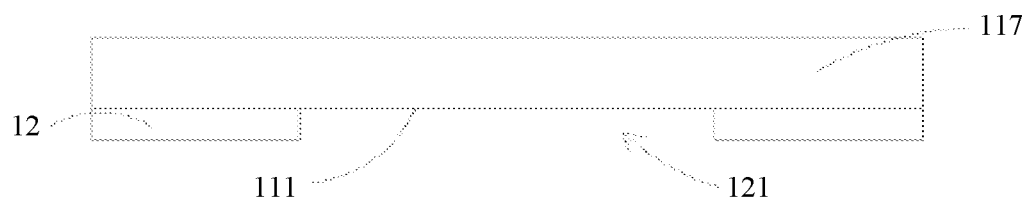
FIG. 3 is a schematic structural diagram of a detection label according to a third embodiment of this application.
Figure 4:
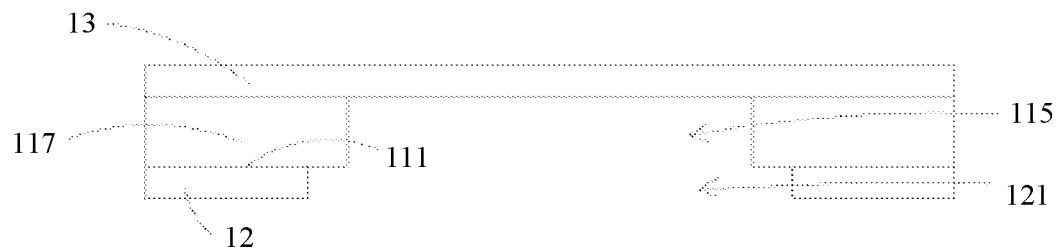
FIG. 4 is a schematic structural diagram of a detection label according to a fourth embodiment of this application.

As shown in FIG. 3 and FIG. 4, in a possible implementation, the detection part 11 is a liquid inlet color-change base material 117.

The detection part 11 is set to be a liquid inlet color-change base material 117, so that after being in contact with liquid, the detection part 11 may change significantly. In a possible design, water-diffusing ink is provided on the liquid inlet color-change base material 117, so that when the liquid inlet color-change base material 117 is in contact with liquid, the water-diffusing ink gradually permeates and diffuses to enable the detection label 1 to change the overall color. Alternatively, a specific pattern or character is drawn on the detection part 11 in advance by using the water-diffusing ink, so that when liquid is in contact with the detection part 11, the water-diffusing ink permeates and diffuses to turn the drawn pattern or character illegible, and after the detection part 11 is dried, the corresponding pattern or character does not restore. In such a design, when liquid flows into the electronic device to cause the fault of the electronic device, with long-term standing or drying treatment, the maintainer can still determine, by observing the detection part 11, whether the fault cause of the electronic device is the liquid flowing into the electronic device.

It should be noted herein that, in the detection label 1 provided in this embodiment of this application, the liquid inlet color-change base material 117 includes but is not limited to: water-diffusing ink. Another common liquid inlet color-change base material 117 may be applied to this application. This is not described herein again.

Figure 6:
FIG. 6 is a schematic structural diagram of a detection label according to a sixth embodiment of this application.

As shown in FIG. 2, FIG. 4, and FIG. 6, in a possible design, the detection label 1 further includes a protection layer 13, where the detection part 11 has a second surface 112, the second surface 112 faces towards the first surface 111, and the protection layer 13 is located on the second surface 112.

With arrangement of the protection layer 13, the detection part 11 can be protected, so as to reduce the possibility that the detection part 11 is damaged and cannot normally detect liquid. After assembling of the electronic device is completed, nano coating treatment is usually performed. That is, the electronic device is placed in a vacuum environment, and a coating material is evaporated to be attached to the electronic device. Density of a nano coating film is relatively high, so that overall waterproof performance of the electronic device can be improved. In a coating process, a part of the material that evaporates into gas enters the electronic device through positions such as a headphone jack and a card slot to be attached to an interior of the electronic device. When the coating material is attached to the detection label 1, liquid cannot permeate through the nano coating film to be in contact with the detection part 11, so that the detection label 1 is void. When liquid flows into the electronic device, the detection label 1 cannot perform detection, and the maintainer cannot primarily determine, by observing the detection part 11, the fault cause of the electronic device and need to take extra time and effort to determine whether the fault cause is the liquid entering the electronic device, thereby causing a decline of maintenance efficiency. In the detection label 1 provided in this embodiment of this application, the protection layer 13 is added on the second surface 112 to increase an overall thickness of the detection label 1. During nano coating, the evaporated material generally has higher concentration in a higher position. Therefore, with arrangement of the protection layer 13, most of the coating material may be attached to the protection layer 13, so as to reduce the possibility that the coating material is attached to the detection part 11, for example, a third surface 113 and a fourth surface 114 of the detection part 11, so that the detection part 11 can be in contact with liquid and normally operate.

As shown in FIG. 2, in a possible implementation, the detection label 1 may include water absorption paper 14, where the water absorption paper 14 may be located on a second surface 112 facing towards the first surface 111.

The water absorption paper 14 has a capillary structure and can absorb inflowing liquid by using the capillary structure, so that the liquid is gathered in the water absorption paper 14. The water absorption paper 14 may be connected to the detection part 11. In a possible design, the water absorption paper 14 is attached to the second surface 112 of the detection part 11. The water absorption paper 14 absorbs liquid and enables the liquid to be in contact with the detection part 11, so that the detection part 11 can detect that liquid flows into the electronic device. In such a design, sensitivity of the detection label 1 can be improved, and accuracy of detection results is improved. When little liquid flows into the electronic device, the liquid can still be in contact with the detection part 11 by using the water absorption paper 14, so as to reduce the possibility that little liquid flowing into the electronic device cannot be detected by the detection part 11.

In addition, the water absorption paper 14 can further protect the electronic device. When liquid flows into the electronic device, the water absorption paper 14 can absorb the liquid, so as to reduce the possibility that liquid flows into the electronic device.

As shown in FIG. 2, in a possible implementation, the first through-hole 121 is provided at the adhesive layer 12, a second through-hole 115 is provided on the detection part 11, a third through-hole 141 is provided on the water absorption paper 14, and the first through-hole 121, the second through-hole 115, and the third through-hole 141 communicate.

The detection part 11, the water absorption paper 14, and the adhesive layer 12 may be all set to be annular. In such a design, when the detection label 1 is processed, layer-by-layer attaching is easy, and positioning is easy. The first through-hole 121, the second through-hole 115, and the third through-hole 141 may communicate to form a flow path, the flow path can implement a guide effect on the inflow liquid, and the inflow liquid flows to the detection label 1 along the flow path to be in contact with the detection part 11, so as to reduce the possibility that liquid flows in other directions and is not in contact with the detection label 1 but directly flows into the electronic device, so that the detection label 1 detects whether liquid flows into the electronic device. In addition, in such a design, an inner surface of the second through-hole 115 and the third surface 113 and the fourth surface 114 of the detection part 11 may all be configured to detect whether liquid flows into the electronic device, so that an area of the detection part 11 for detection can be increased, and sensitivity of the detection label 1 is improved.

A diameter of the second through-hole 115 may be the same as a diameter of the first through-hole 121. However, in such a design, liquid flowing in from the side of the housing needs to flow into the second through-hole 115 through the first through-hole 121 to be in contact with the inner surface of the second through-hole 115, and then the detection part 11 can detect the liquid. Consequently, an area of the detection part 11 used for detection is relatively small. In the detection label 1 provided in this embodiment of this application, a diameter of the second through-hole 115 may be less than a diameter of the first through-hole 121. In such a design, the first surface 111 can be partially configured to detect liquid, so that it is easier for the detection part 11 to be in contact with the liquid flowing into the first through-hole 121, and accuracy of detection results of the detection label 1 is improved.

It should be noted herein that, in the detection label provided in this embodiment of this application, the water absorption paper 14 and the protection layer 13 may be arranged based on actual situations, and when the detection part 11 has relatively high water absorption performance or damage resistance capability, the water absorption paper 14 and the protection layer 13 may be selectively arranged, that is, only one or both of them may be arranged.

Figure 5:
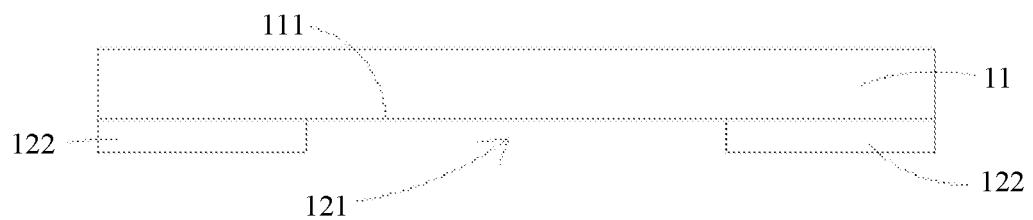
FIG. 5 is a schematic structural diagram of a detection label according to a fifth embodiment of this application.

As shown in FIG. 5 and FIG. 6, the adhesive layer 12 may be a water color-change adhesive layer 122. In a possible implementation, water-soluble pigments may be disposed at the adhesive layer 12, when liquid flows into the electronic device from the side of the housing 2, the liquid is in contact with the adhesive layer 12 first, the water-soluble pigments at the adhesive layer 12 change after being in contact with the liquid to enable the adhesive layer 12 to change the color. The maintainer can determine, by observing the detection part 11 during maintenance of the electronic device, whether liquid flows into the electronic device. When the detection part 11 changes the color, the maintainer can further observe the color of the adhesive layer 12 to determine the direction from which the liquid flows into the electronic device. When the adhesive layer 12 does not change the color, it may be determined that the liquid flows into the electronic device from a side of the detection label 1 away from the housing 2. When the adhesive layer 12 changes the color, it may be determined that the liquid flows into the electronic device from the side of the housing 2. The maintainer can locate a damaged part of the electronic device based on the inflow direction of the liquid. Then, specific maintenance measures can be taken.

Figure 7:
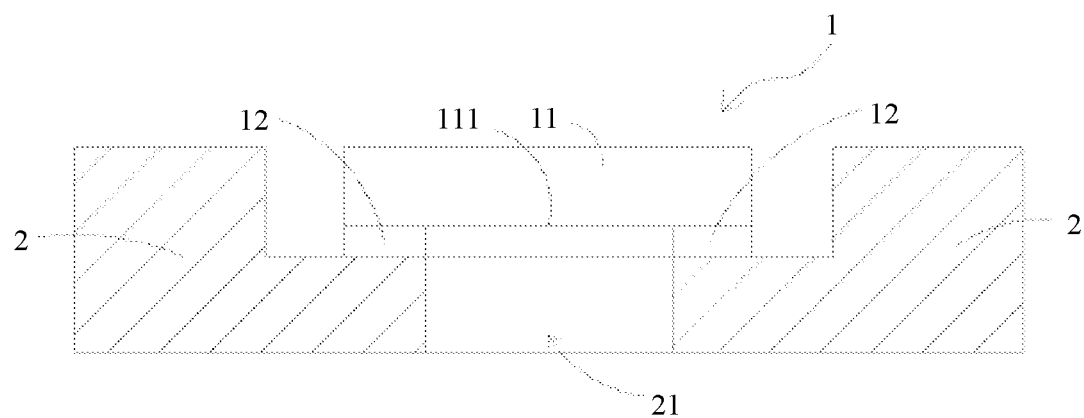
FIG. 7 is a partial schematic structural diagram of an electronic device according to an embodiment of this application.

In addition, as shown in FIG. 7, an embodiment of this application further provides an electronic device. The electronic device may include a housing 2 and a detection label 1 for an electronic device, where the detection label 1 is connected to the housing 2, and a connection manner may be attaching. Specifically, the detection label 1 may be disposed in positions of the housing 2 that have a jack, a slot, or the like where a water inlet event may easily occur, so that the detection label 1 detects whether liquid flows into the electronic device.

The detection label 1 may be the detection label 1 according to any one of the foregoing embodiments. The detection label 1 has the foregoing technical effects, so that the electronic device including the detection label 1 also has corresponding technical effects. This is not described herein again.

Figure 8:
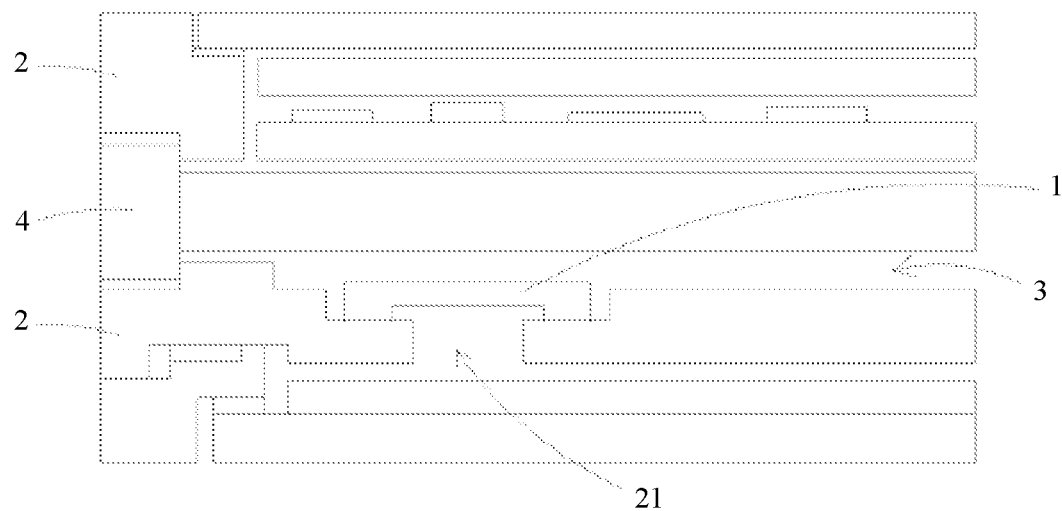
FIG. 8 is a schematic structural diagram of a detection label applied to a cooperation position of a card slot and a card tray according to an embodiment of this application.
Figure 9:
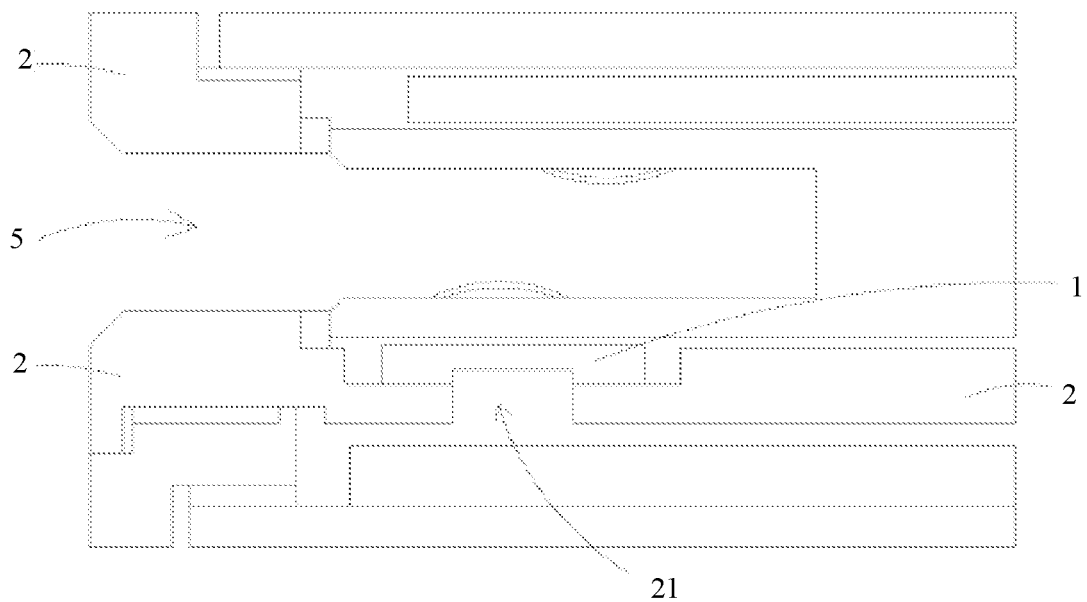
FIG. 9 is a schematic structural diagram of a detection label applied to a headphone jack according to an embodiment of this application.
Figure 10:
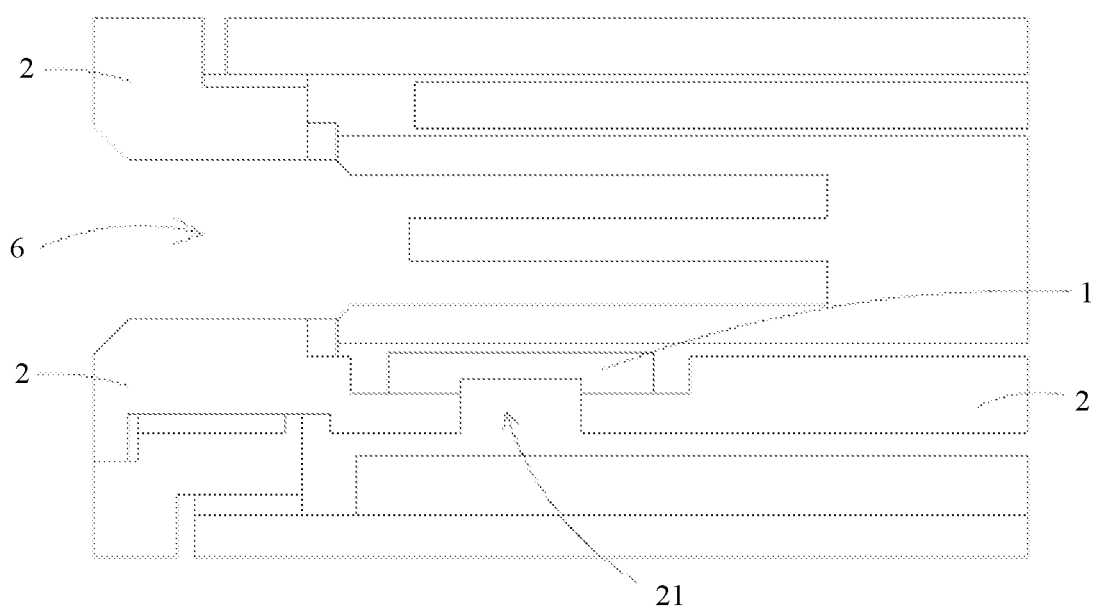
FIG. 10 is a schematic structural diagram of a detection label applied to a USB interface according to an embodiment of this application.

Specifically, as shown in FIG. 8 to FIG. 10, the detection label 1 provided in this embodiment of this application may be applied to positions such as a cooperation position of a card slot 3 and a card tray 4, a headphone jack 5, and a USB (Universal Serial Bus, Universal Serial Bus) interface 6.

A fourth through-hole 21 is provided on a position of the housing 2 inside or near the headphone jack 5, the cooperation position of the card slot 3 and the card tray 4, and the USB interface 6. At least a part of the detection part 11 can communicate with the fourth through-hole 21.

When liquid flows into the headphone jack 5, the cooperation position of the card slot 3 and the card tray 4, and the USB interface 6, the liquid can be in contact with the detection part 11 and enable the detection part 11 to change correspondingly. When liquid flows in from the side of the housing 2, the liquid can flow to the detection part 11 through the fourth through-hole 21 to be in contact with the detection part 11 and enable the detection part 11 to change correspondingly.

In the electronic device provided in this embodiment of this application, the fourth through-hole 21 is provided on the housing, liquid flowing in from the side of the housing 2 can be detected by the detection label 1, and the detection label 1 can perform detection in a plurality of directions, so that accuracy of detection results of the detection label 1 is improved, and it is easier for the maintainer to determine the fault cause of the electronic device.

An embodiment of this application provides a detection label 1 for an electronic device and an electronic device. The detection label 1 includes a detection part 11 and an adhesive layer 12, where the detection part 11 is configured to detect whether liquid flows into an electronic device, and the adhesive layer 12 is configured to connect the detection part 11 to a housing 2 of the electronic device. Specifically, when being in contact with liquid, the detection part 11 may change significantly, for example, change the color or change the form (may swell or have other changes), so that the maintainer can determine, by observing the detection part 11, whether liquid flows into the electronic device. The detection part 11 has a first surface 111, the first surface 111 is a surface of a side facing towards the housing 2, the adhesive layer 12 may be disposed on the first surface 111, and an area of the adhesive layer 12 is less than an area of the first surface 111. In this way, a part of the first surface 111 is not covered with the adhesive layer 12, and liquid can be in contact with the first surface 111, so that the first surface 111 can also be configured to detect whether liquid flows into the electronic device, and the detection part 11 can perform detection in a plurality of directions simultaneously. When liquid flows in from any direction, the detection part 11 can be in contact with the liquid and change, so as to remind the maintainer that liquid flows into the electronic device.

The foregoing descriptions are merely preferred embodiments of this application, but are not intended to limit this application. Persons skilled in the art understand that this application may have various modifications and variations. Any modification, equivalent replacement, and improvement made without departing from the spirit and principle of this application shall fall within the protection scope of this application.

The invention claimed is:

1. A detection apparatus comprising:
    a detection part having a first surface, a second surface opposite to the first surface, and a first through-hole, wherein the detection part is configured to detect whether liquid flows into an electronic device;
    an adhesive layer located on the first surface, wherein the adhesive layer is configured to connect the detection part to a housing of the electronic device, the adhesive layer has a second through-hole, and an area of the adhesive layer is less than an area of the first surface; and
    a water absorption paper located on the second surface, wherein the water absorption paper has a third through-hole.

2. The detection apparatus according to claim 1, wherein at least one first through-hole is provided at the adhesive layer, and in a direction perpendicular to the first surface, the first through-hole runs through the adhesive layer.

3. The detection apparatus according to claim 1, wherein the adhesive layer is annular, and the adhesive layer is disposed along an edge of the first surface.

4. The detection apparatus according to claim 1, wherein the detection part is a water-soluble color layer.

5. The detection apparatus according to claim 1, wherein the detection part is a liquid inlet color-change base material.

6. The detection apparatus according to claim 1, wherein the detection label further comprises a protection layer, the detection part has a second surface, the second surface faces towards the first surface, and the protection layer is located on the second surface.

7. The detection apparatus according to claim 1, wherein the first through-hole, the second through-hole, and the third through-hole communicate.

8. The detection apparatus according to claim 1, wherein the adhesive layer is a water color-change adhesive layer.

9. An electronic device, wherein the electronic device comprises a housing and a detection label connected to the housing, wherein the detection label comprises:
    a detection part having a first surface, a second surface opposite to the first surface, and a first through-hole, wherein the detection part is configured to detect whether liquid flows into an electronic device;
    an adhesive layer located on the first surface, wherein the adhesive layer is configured to connect the detection part to a housing of the electronic device, the adhesive layer has a second through-hole, and an area of the adhesive layer is less than an area of the first surface; and
    a water absorption paper located on the second surface, wherein the water absorption paper has a third through-hole.

10. The electronic device according to claim 9, wherein the housing comprises a fourth through-hole, and at least a part of the detection part communicates with the fourth through-hole.

11. The electronic device according to claim 9, wherein the electronic device comprises a housing, the housing comprises a fourth through-hole, and at least a part of the detection part communicates with the fourth through-hole.

12. The electronic device according to claim 11, wherein the electronic device comprises a housing, the housing comprises a fourth through-hole.

13. The electronic device according to claim 12, wherein the fourth through-hole, and the first through-hole communicate to form a flow path.

14. The electronic device according to claim 13, wherein liquid flowing in from a side of the housing can flow to the detection part along the flow path.

* * * * *

UNITED STATES PATENT AND TRADEMARK OFFICE
CERTIFICATE OF CORRECTION

| | |
|---|---|
| PATENT NO. | : 12,326,382 B2 |
| APPLICATION NO. | : 17/802294 |
| DATED | : June 10, 2025 |
| INVENTOR(S) | : Yuan Wang and Xuyang Wang |

Page 1 of 1

It is certified that error appears in the above-identified patent and that said Letters Patent is hereby corrected as shown below:

In the Specification

In Column 1, In Line 11 (Approx.), Delete "20/201,0122716.4," and insert -- 202010122716.4, --.

Signed and Sealed this
Twenty-second Day of July, 2025

Coke Morgan Stewart
*Acting Director of the United States Patent and Trademark Office*